United States Patent [19]

Otani et al.

[11] Patent Number: 5,277,787
[45] Date of Patent: Jan. 11, 1994

[54] METHOD OF MAUNFACTURING PRINTED WIRING BOARD

[75] Inventors: Yasuaki Otani; Fusao Birukawa; Tatero Takai, all of Saitama, Japan

[73] Assignee: Nippon CMK Corp., Japan

[21] Appl. No.: 967,782

[22] Filed: Oct. 28, 1992

[30] Foreign Application Priority Data

Jan. 30, 1992 [JP] Japan .................................. 4-40177

[51] Int. Cl.⁵ ............................................... C25D 5/02
[52] U.S. Cl. ................................................... 205/125
[58] Field of Search ........................................ 205/125

[56] References Cited

U.S. PATENT DOCUMENTS 4,808,273 2/1989 Hua ..................................... 205/125

Primary Examiner—T. M. Tufariello
Attorney, Agent, or Firm—Bruce L. Adams; Van C. Wilks

[57] ABSTRACT

A method of manufacturing printed wiring board is disclosed. The method comprising steps of providing a double-sided copper clad laminate; embedding a conductive ink into a through hole provided in the copper clad laminate; subjecting the opposing surfaces of the double-sided copper clad laminate to copper electroplating to form a copper plated layer after curing the conductive ink under the given conditions; providing a circuit for displacing component mounting lands onto the copper plated layer directly over the cured conductive ink with the use of a dry film or ink for forming other circuit; and forming a printed wiring circuit with the material removing treatment.

2 Claims, 1 Drawing Sheet

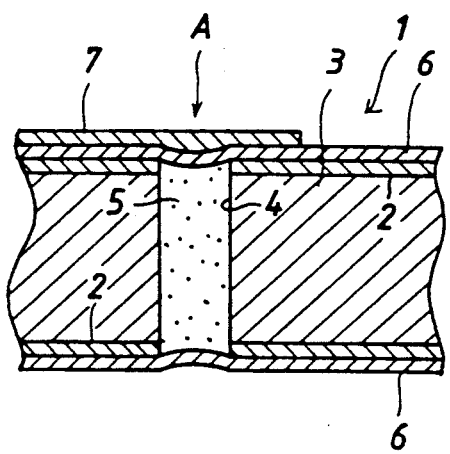
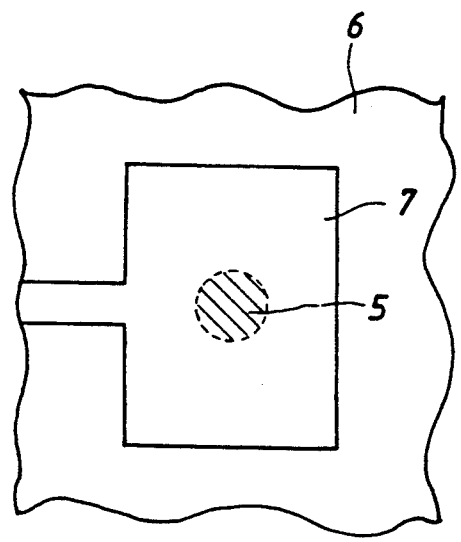
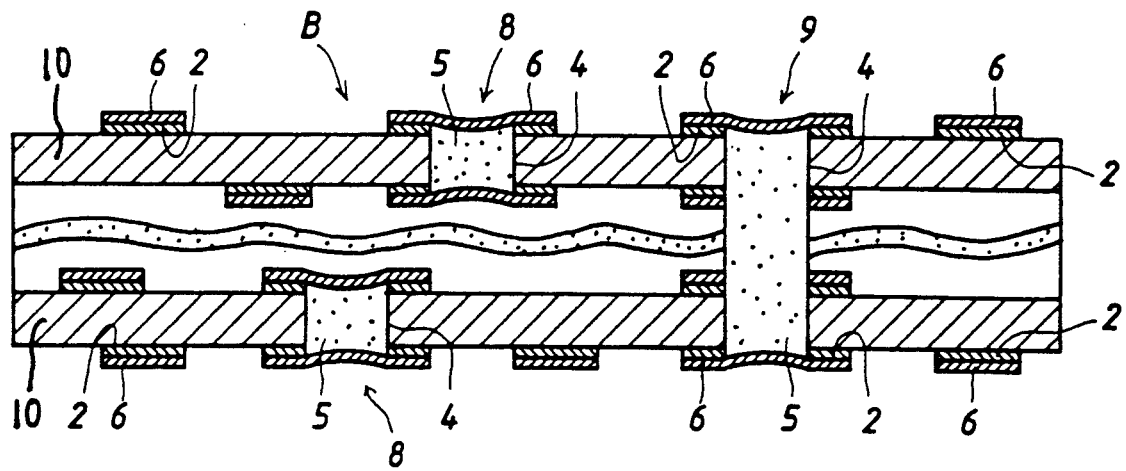

METHOD OF MANUFACTURING PRINTED WIRING BOARD

BACKGROUND OF THE INVENTION

The present invention relates to a method of manufacturing printed wiring board.

In case of obtaining printed wiring board with the use of double-sided copper clad laminates (including multi-layer base material), generally, there is adopted a method of respectively forming through holes for conducting surface mounting lands to the circuits of both face and back surface onto opposing major surfaces of the copper clad laminate (refer to as first conventional example).

Moreover, instead of this first example, there is a method of providing component mounting lands by at first subjecting the through holes to copper electroplating, embedding conductive ink such as copper paste in the through holes, and performing copper electroplating on the through holes (refer to as second conventional example).

In the first conventional example, the through holes presenting only conduction require corresponding area in design, so that the base material must also be increased correspondingly.

Moreover, in the second conventional example which subject copper electroplating in the through holes previously, the copper electroplating step becomes expensive.

SUMMARY OF THE INVENTION

It is an object of the present invention to eliminate the above disadvantages

It is another object of the present invention to provide a method of manufacturing printed wiring board having a base material or plate with large mounting aria and inexpensive price.

According to the present invention, there is provided a method of manufacturing printed wiring board comprising steps of:

providing a double-sided copper clad laminate;

embedding a conductive ink into a through hole provided in the copper clad laminate;

subjecting the opposing surfaces of the double-sided copper clad laminate to copper electroplating to form a copper plated layer after curing the conductive ink under the given conditions;

providing a circuit for displacing component mounting lands onto the copper plated layer directly over the cured conductive ink with the use of a dry film or ink for forming other circuit; and forming the circuit with the material removing treatment.

The material removing treatment is an etching treatment.

According to the present invention, a mounting land and a through hole for electrically connecting opposing major surfaces of the printed wiring board are placed in the same line or connected by the via hole in the circuit, so that design or component mounting density becomes very large, thereby obtaining an inexpensive product with large mounting area.

BRIEF DESCRIPTION OF THE DRAWINGS

FIG. 1 is a cross sectional view showing a part of a product manufactured by a method of manufacturing printed wiring board according to the present invention;

FIG. 2 is a plan view showing a part of a product manufactured by a method of manufacturing printed wiring board according to the present invention; and FIG. 3 is an explanatory view showing another embodiment of the multi-layer printed wiring board fabricated by the method according to the present invention.

DETAILED EXPLANATION OF THE PREFERRED EMBODIMENT

Now to the drawings, there are shown various embodiments of a method of manufacturing a printed wiring board according to the present invention. Like parts are shown by corresponding reference characters throughout the several views of the drawings.

FIG. 1 is a cross sectional view showing a part of product obtained by a method of manufacturing a printed wiring board according to the present invention, and FIG. 2 is a plan view thereof.

In this embodiment, a copper clad laminate 1 comprising for example, a base material 3 and two copper foils 2 having thickness of 18 $\mu$m adhered on opposing surfaces thereof, is cut out with adequate size and this copper clad laminate 1 is provided with through holes 4 by using an NC drilling machine (not shown).

Then, a conductive ink 5 is embedded in the through holes 4 with silk screen printing and the inductive ink cured. After cured the inductive ink 5, if a portion of the cured inductive ink 5 is extruded from the surface of the copper clad laminate 1, a brush polishing grinds the extruded portion of the copper clad laminate 1 flat and smooth, and then a copper electroplating is performed over the opposing surfaces of the copper clad laminate 1 including the exposed portion of the conductive ink 5, thereby forming a copper plate layer 6.

A circuit for providing a mounting land is applied onto the copper plated layer 6 including the conductive ink 5 with the use of a dry film or a circuit forming ink, a circuit including component mounting land 7 is formed with etching or the like, solder resist or the like is applied and then machining is performed by conventional technic for press workings, thereby obtaining a printed wiring board A.

Means for embedding the conductive ink 5 in the through hole 4 is a squeezing means and it is preferred that the diameter of the through hole is as small as possible, for example, of 0.3 mm or 0.4 mm so as to connect the circuit to the surface of the copper clad laminate.

When a through hole for inserting components is provided in the printed wiring board A, a copper electroless plating is performed to make the component inserting through hole conductive, and then the copper electroplating step is performed.

The essential features of the method of manufacturing printed wiring board are the step of embedding conductive ink in the through hole and the step of forming copper plated layer all over the surface of the copper clad laminate including the surface in which the conductive ink is embedded, so that formation of the circuit and application of the solder resist are performed with the use of conventional technic.

It is certain that when the conductive ink is embedded in the through hole, the portion of the conductive ink extruded from the surface of the copper clad laminate is removed by grinding or polishing, so as to obtain the same plane as the copper foil.

According to the present invention, a printed wiring circuit is formed by subjecting a portion in which the conductive ink is embedded, to a copper plating treatment and the through holes are present in the component mounting lands and the circuit, so that it is certain that adhesion of the conductive ink to the copper plating can be able to resist to heating at component mounting.

The present invention can be applied to a multilayer base material. In this case, as shown in FIG. 3, a through hole or via hole 9 with component mounting lands 6 can be constructed while connecting them to internal layer circuits, and it can be utilized as an inner via hole 8.

As an embodiment of a multilayer printed wiring board according to the above construction, a four layer printed wiring board B is shown in FIG. 3, in which reference numeral 10 is a prepreg (or adhesive sheet).

The manufacturing method can adopt the previous embodiment shown in FIGS. 1 and 2.

What is claimed is:

1. A method of manufacturing printed wiring board comprising steps of:

providing a double-sided copper clad laminate;

embedding a conductive ink into a through hole provided in the copper clad laminate;

subjecting the opposing surfaces of the double-sided copper clad laminate to copper electroplating to form a copper plated layer after curing the conductive ink under the given conditions;

providing a circuit for displacing component mounting lands onto the copper plated layer directly over the cured conductive ink with the use of a dry film or ink for forming other circuit; and forming a printed wiring circuit with the material removing treatment.

2. A method of manufacturing printed wiring board as claimed in claim 1, wherein the material removing treatment is an etching treatment.

* * * * *